United States Patent
Zehavi et al.

(10) Patent No.: US 10,198,383 B2
(45) Date of Patent: Feb. 5, 2019

(54) SYSTEMS AND METHODS OF ADJUSTING AN INTERFACE BUS SPEED

(71) Applicant: SANDISK TECHNOLOGIES LLC, Plano, TX (US)

(72) Inventors: Mordekhay Zehavi, Raanana (IL); Yonatan Tzafrir, Petah Tikva (IL); Mahmud Asfur, Bat-Yam (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 35 days.

(21) Appl. No.: 15/396,482

(22) Filed: Dec. 31, 2016

(65) Prior Publication Data

US 2018/0189211 A1 Jul. 5, 2018

(51) Int. Cl.
| | |
|---|---|
| G06F 13/362 | (2006.01) |
| G06F 13/42 | (2006.01) |
| G06F 12/02 | (2006.01) |
| G11C 7/22 | (2006.01) |
| G11C 29/02 | (2006.01) |
| G11C 7/10 | (2006.01) |

(52) U.S. Cl.
CPC ...... *G06F 13/3625* (2013.01); *G06F 12/0238* (2013.01); *G06F 13/4291* (2013.01); *G11C 7/222* (2013.01); *G11C 29/022* (2013.01); *G11C 29/023* (2013.01); *G11C 29/028* (2013.01); *G06F 2212/202* (2013.01); *G11C 7/1039* (2013.01)

(58) Field of Classification Search
CPC ............. G06F 13/3625; G06F 12/0238; G06F 13/4291; G06F 2212/202; G11C 7/1039
See application file for complete search history.

(56) References Cited

U.S. PATENT DOCUMENTS

| | | | |
|---|---|---|---|
| 7,446,592 B2 | 11/2008 | Tripathi et al. | |
| 7,800,975 B2* | 9/2010 | Rombach | G11C 7/1051 365/233.1 |
| 8,411,517 B2 | 4/2013 | Choi | |
| 8,484,522 B2 | 7/2013 | Flynn et al. | |
| 8,520,455 B2* | 8/2013 | Ross | G11C 8/18 365/185.18 |
| 2006/0031710 A1 | 2/2006 | Jo | |
| 2007/0018712 A1 | 1/2007 | Gk et al. | |

(Continued)

OTHER PUBLICATIONS

Micron © 3D NAND Flash Memory; 2016; Micron Technologies Inc.; pp. 1-2 (Year: 2016).*

(Continued)

*Primary Examiner* — Idriss N Alrobaye
*Assistant Examiner* — Richard B Franklin
(74) *Attorney, Agent, or Firm* — Patterson & Sheridan, LLP; Steven Versteeg

(57) ABSTRACT

A device includes a first latch configured to be coupled to a bus and configured to receive a data signal and a clock signal. The device also includes a delay element configured to generate a delayed version of the data signal or a delayed version of the clock signal. A second latch is coupled to the delay element and configured to receive the delayed version of the data signal or the delayed version of the clock signal. The device further includes a comparator coupled to the first latch and the second latch. The comparator is configured to receive a first output from the first latch and a second output from the second latch.

19 Claims, 8 Drawing Sheets

(56) References Cited

U.S. PATENT DOCUMENTS

| | | |
|---|---|---|
| 2014/0143593 A1 | 5/2014 | Strauss et al. |
| 2015/0003156 A1 | 1/2015 | Berckmann et al. |
| 2015/0067419 A1 | 3/2015 | Raghu et al. |
| 2015/0187442 A1 | 7/2015 | Sivasankaran et al. |

OTHER PUBLICATIONS

Tzafrir, Yonatan. "Interface Adjustment Processes for a Data Storage Device," U.S. Appl. No. 14/812,794, filed Jul. 29, 2015, 63 pages.

* cited by examiner

SYSTEMS AND METHODS OF ADJUSTING AN INTERFACE BUS SPEED

FIELD OF THE DISCLOSURE

This disclosure is generally related to data storage devices and more specifically to an interface bus between components of a data storage device.

BACKGROUND

During operation of a data storage device, data may be communicated between a controller and a memory of the data storage device via a data bus that couples the controller and the memory. For example, one or more data values may be provided to or received from the data bus at a transfer rate based on a frequency of a clock signal. To illustrate, a first data value may be provided to the data bus from the controller in response to a rising edge of the clock signal. As another example, a second data value may be received from the data bus and stored at the controller in response to a falling edge of the clock signal.

A data storage device may be designed to have a fixed clock frequency that allows sufficient setup and hold times to enable reliable transmission and sampling of data over a bus interface between integrated circuits (e.g., a controller and a non-volatile memory). Typically, large margins are provided with respect to the clock frequency to account for worst-case scenarios (e.g., worst-case silicon process speed, system voltage, and system temperature (PVT) conditions) that may occur during operation of the data storage device. Setting the clock frequency (e.g., a data transfer rate) to the fixed value may avoid errors that may occur if the data transfer rate is too high in such worst-case scenarios. However, by operating the data storage device (e.g., the bus) at a clock frequency based on the worst-case scenarios, a data transfer rate (e.g., a bus speed) may be significantly lower than a theoretical maximum data transfer rate of the bus.

DETAILED DESCRIPTION

Figure 1:
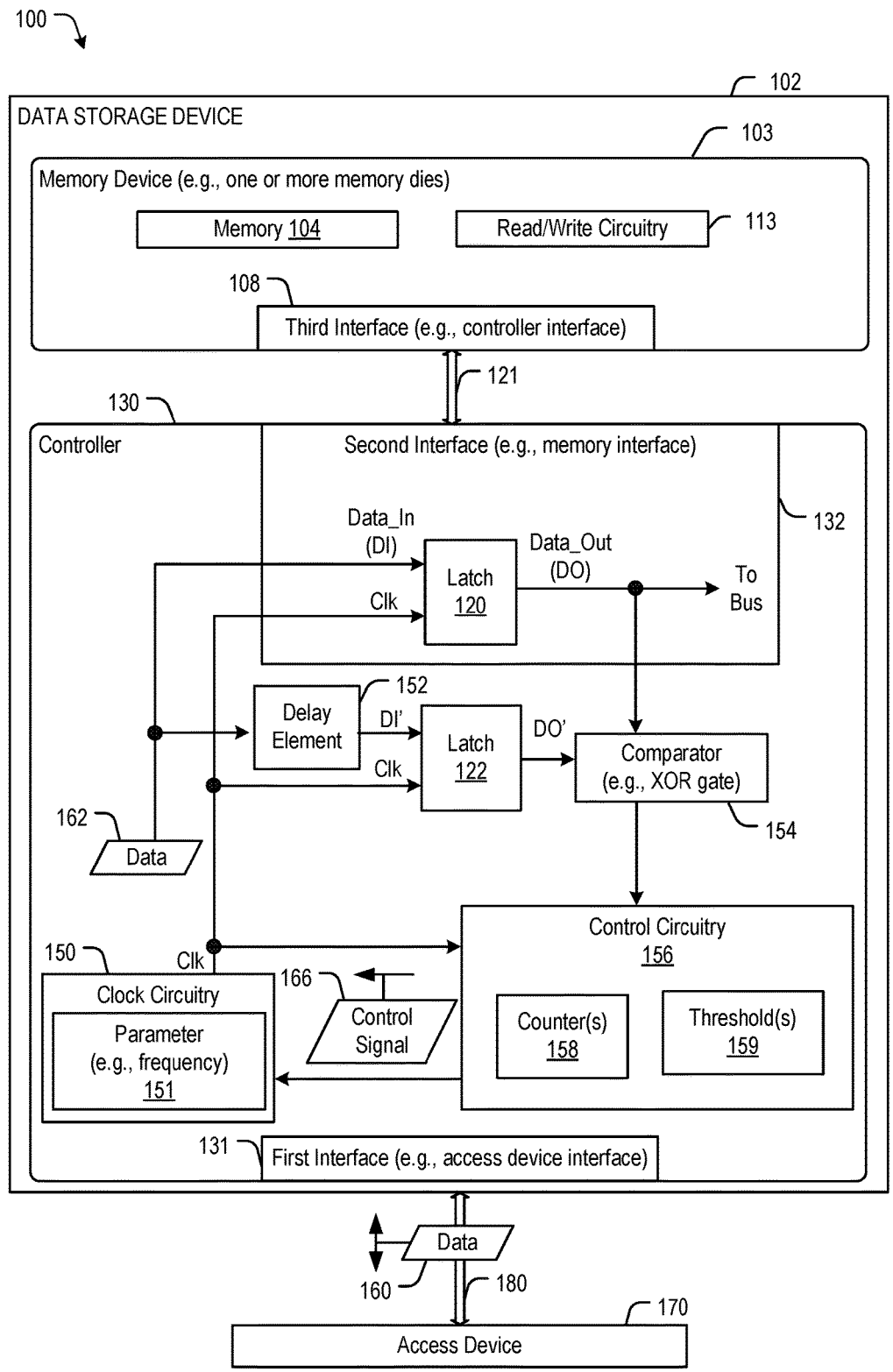
FIG. 1 is a block diagram of a particular illustrative example of a system including a data storage device operable to adjust a speed of an interface bus.

Particular aspects of the present disclosure are described below with reference to the drawings. In the description, common features are designated by common reference numbers. Although certain examples are described herein with reference to a data storage device, it should be appreciated that techniques described herein are applicable to other implementations. Further, it is to be appreciated that certain ordinal terms (e.g., "first" or "second") may be provided for ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." Further, an operation performed "based on" a condition or event may also be performed based on one or more other conditions or events not explicitly recited. As used herein, "examplary" may indicate an example, an implementation, and/or an aspect, and should not be construed as limiting or as indicating a preference or a preferred example, implementation, and/or aspect.

The present disclosure describes systems and methods of identifying a risk of a setup/hold violation associated with a data bus interface and adjusting one or more operating parameters, such as a frequency of a clock signal, based on the identified risk. For example, a first latch, e.g., a first flip-flop, of a data bus interface may experience a setup/hold violation as PVT conditions associated with the data bus interface change over time.

To identify the risk of a setup/hold violation, the first latch is configured to receive a data signal and a clock signal. Additionally, a second latch (e.g., a second flip-flop) is configured to receive a delayed version of the data signal or a delayed version of the clock signal. For example, the second latch may receive a delayed version of the data signal and may receive the clock signal. As another example, the second latch may receive the data signal and may receive a delayed version of the clock signal. To delay the data signal or the clock signal, a delay element (e.g., a delay circuit) receives the data signal or the clock signal and provides a delayed version the received data signal or the received clock signal to the second latch to "artificially" increase a setup time or a hold time of the second latch.

Each of a first output of the first latch and a second output of the second latch is provided to a comparator, such as an exclusive-OR (XOR) logic gate. The outputs of the first latch and the second latch are compared to determine whether the first output (of the first latch) matches the second output (of the second latch). If the first output and the second output do not match (e.g., are not the same), a risk of a setup/hold violation may be identified.

In some implementations, control circuitry may monitor an output of the comparator and control operation of clock circuitry configured to generate the clock signal. For example, based on an output of the comparator that indicates a risk of a setup/hold violation, the control circuitry may adjust one or more parameters, such as a clock frequency of the clock signal, a data signal-to-clock signal phase shift, a system voltage, or a combination thereof. To illustrate, based on an output of the comparator that indicates a risk of a setup/hold violation, the control circuitry may reduce a clock frequency of the clock signal. As another example, based on an output of the comparator that does not indicate a risk of a setup/hold violation, the control circuitry may increase a clock frequency of the clock signal.

By using the delay element and the second latch, the first output (of the first latch) and the second output (of the second latch) can be compared to provide a real-time (i.e., "on the fly") measure of a risk of setup and hold time violations. The real-time measure may enable operation of the data bus interface (e.g., a bus) at a "maximal" reliable clock frequency. For example, the "on the fly" monitoring of bus operations may provide a real-time warning of nearing a condition of a setup time violation or a hold time violation. In response to identification of a risk of a setup/hold time violation, one or more parameters may be adjusted to avoid the setup/hold time violation. By adjusting one or more parameters, such as the frequency of the clock signal, the data bus interface can reliably operate with a "maximal" frequency (without setup/hold violations) during different operating conditions that result from changing PVT conditions. Accordingly, the data bus interface may operate at rate that is higher than a rate appropriate for a worst-case scenario, thus improving an overall performance of the data bus interface.

FIG. 1 depicts an illustrative example of a system 100. The system 100 includes a data storage device 102 and an access device 170. The data storage device 102 includes a controller 130 and a memory device 103 that is coupled to the controller 130. The memory device 103 may include one or more memory dies.

The data storage device 102 and the access device 170 may be coupled via a connection (e.g., a communication path 180), such as a bus or a wireless connection. The data storage device 102 may include a first interface 131 (e.g., an access device interface) that enables communication via the communication path 180 between the data storage device 102 and the access device 170.

In some implementations, the data storage device 102 may be attached to or embedded within one or more access devices, such as within a housing of the access device 170. For example, the data storage device 102 may be embedded within the access device 170, such as in accordance with a Joint Electron Devices Engineering Council (JEDEC) Solid State Technology Association Universal Flash Storage (UFS) configuration. For example, the data storage device 102 may be configured to be coupled to the access device 170 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). To further illustrate, the data storage device 102 may be integrated within an apparatus, such as a mobile telephone, a computer (e.g., a laptop, a tablet, or a notebook computer), a music player, a video player, a gaming device or console, an electronic book reader, a personal digital assistant (PDA), a portable navigation device, or other device that uses non-volatile memory.

In other implementations, the data storage device 102 may be implemented in a portable device configured to be selectively coupled to one or more external access devices. For example, the data storage device 102 may be removable from the access device 170 (i.e., "removably" coupled to the access device 170). As an example, the data storage device 102 may be removably coupled to the access device 170 in accordance with a removable universal serial bus (USB) configuration. In still other implementations, the data storage device 102 may be a component (e.g., a solid-state drive (SSD)) of a network accessible data storage system, such as an enterprise data system, a network-attached storage system, a cloud data storage system, etc.

In some implementations, the data storage device 102 may include or correspond to a solid state drive (SSD) which may be included in, or distinct from (and accessible to), the access device 170. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 is coupled to the access device 170 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a solid-state drive (SSD) device) of a data center storage system, an enterprise storage system, or a storage area network.

The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof. In some implementations, the data storage device 102 and the access device 170 may be configured to communicate using one or more protocols, such as an eMMC protocol, a universal flash storage (UFS) protocol, a universal serial bus (USB) protocol, a serial advanced technology attachment (SATA) protocol, and/or another protocol, as illustrative, non-limiting examples.

The access device 170 may include a memory interface (not shown) and may be configured to communicate with the data storage device 102 via the memory interface to read data from and write data to the memory device 103 of the data storage device 102. For example, the access device 170 may operate in compliance with a Joint Electron Devices Engineering Council (JEDEC) industry specification, such as a Universal Flash Storage (UFS) Access Controller Interface specification. As other examples, the access device 170 may operate in compliance with one or more other specifications, such as a Secure Digital (SD) Access Controller specification, as an illustrative, non-limiting example. The access device 170 may communicate with the memory device 103 in accordance with any other suitable communication protocol.

The access device 170 may include a processor and a memory. The memory may be configured to store data and/or instructions that may be executable by the processor. The memory may be a single memory or may include multiple memories, such as one or more non-volatile memories, one or more volatile memories, or a combination thereof. The access device 170 may issue one or more commands to the data storage device 102, such as one or more requests to erase data, read data from, or write data to the memory device 103 of the data storage device 102. For example, the access device 170 may be configured to provide data, such as data 160, to be stored at the memory device 103 or to request data to be read from the memory device 103. The access device 170 may correspond to a mobile telephone, a computer (e.g., a laptop, a tablet, or a notebook computer), a music player, a video player, a gaming device or console, an electronic book reader, a personal digital assistant (PDA), a portable navigation device, a computer, such as a laptop computer or notebook computer, a network computer, a server, any other electronic device, or any combination thereof, as illustrative, non-limiting examples.

The memory device 103 of the data storage device 102 may include one or more memory dies (e.g., one memory die, two memory dies, eight memory dies, or another number of memory dies). The memory device 103 includes a memory 104, such as a non-volatile memory of storage elements included in a memory die of the memory device 103. For example, the memory 104 may include a flash memory, such as a NAND flash memory, as illustrative, non-limiting examples. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

The memory device 103 may include support circuitry, such as read/write circuitry 113, to support operation of one or more memory dies of the memory device 103. Although depicted as a single component, the read/write circuitry 113 may be divided into separate components of the memory device 103, such as read circuitry and write circuitry. The read/write circuitry 113 may be external to the one or more dies of the memory device 103. Alternatively, one or more individual memory dies of the memory device 103 may include corresponding read/write circuitry that is operable to read data from and/or write data to storage elements within the individual memory die independent of any other read and/or write operations at any of the other memory dies.

The memory 104 may include one or more blocks. Each of the blocks may include one or more groups of storage elements (also referred to herein as memory cells). Each group of storage elements may include multiple storage elements (e.g., memory cells) and may be configured as a word line. A word line may function as a single-level-cell (SLC) word line, as a multi-level-cell (MLC) word line, or as a tri-level-cell (TLC) word line, as illustrative, non-limiting examples. Each storage element of the memory 104 may be programmable to a state (e.g., a threshold voltage in a flash configuration or a resistive state in a resistive memory configuration) that indicates one or more values. Each word line of the memory 104 may include one or more portions, such as one or more sectors. Each sector may be configured to store data, such as a codeword (e.g., a page of data). For example, a codeword may include a data portion (e.g., data bits) and a parity portion (e.g., parity bits).

The memory device 103 is coupled to the controller 130 via a bus 121 (e.g., a data bus). For example, the controller 130 includes a second interface 132 (e.g., a memory interface) that is coupled to a third interface 108 (e.g., a controller interface) of the memory device 103. The bus 121 may include one or more channels to enable the controller 130 to communicate with a single memory die of the memory device 103. As another example, the bus 121 may include multiple distinct channels to enable the controller 130 to communicate with each memory die of the memory device 103 in parallel with, and independently of, communication with other memory dies of the memory device 103.

The controller 130 is configured to receive data and instructions from the access device 170 and to send data to the access device 170. For example, the controller 130 may send data to the access device 170 via the first interface 131, and the controller 130 may receive data from the access device 170 via the first interface 131. The controller 130 is configured to send data and commands to the memory 104 and to receive data from the memory 104. For example, the controller 130 is configured to send data and a write command to cause the memory 104 to store data to a specified address of the memory 104. The write command may specify a physical address of a portion of the memory 104 (e.g., a physical address of a word line of the memory 104) that is to store the data. The controller 130 may also be configured to send data and commands to the memory 104 associated with background scanning operations, garbage collection operations, and/or wear leveling operations, etc., as illustrative, non-limiting examples. The controller 130 is configured to send a read command to the memory 104 to access data from a specified address of the memory 104. The read command may specify the physical address of a portion of the memory 104 (e.g., a physical address of a word line of the memory 104).

The controller 130 includes the second interface 132 (e.g., a data bus interface including a first latch 120 and configured to be coupled to the bus 121), a second latch 122, clock circuitry 150, a delay element 152, a comparator 154, and control circuitry 156. The clock circuitry 150 is configured to generate a clock signal Clk. The clock signal Clk is provided to the first latch 120 and the second latch 122. The clock circuitry 150 may include a parameter 151 that may be dynamically adjusted during operation of the data storage device 102. In a particular implementation, the parameter 151 indicates a value of a frequency of the clock signal Clk generated by the clock circuitry 150.

The first latch 120 is configured to be coupled to the bus 121 (e.g., a data bus). In some implementations, the first latch 120 comprises a flop-flop. The first latch 120 is configured to receive a data signal (e.g., Data_In (DI)) corresponding to data 162. The first latch 120 is also configured to receive the clock signal Clk. The first latch 120 is configured to generate a first output (e.g., Data_Out (DO)) responsive to the clock signal Clk and the data signal DI. The first output of the first latch 120 is provided to the bus 121 and to the comparator 154. The speed of the first latch 120 (e.g., a speed of the interface 121) may be dictated by setup and hold time requirements, which may depend on the silicon PVT (Silicon Process speed, System Voltage and System Temperature) conditions of the data storage device 102.

The second latch 122 is coupled to the delay element 152 and is configured to receive the clock signal Clk and a delayed version DI' of the data signal (e.g., the data 162). For example, the delayed version DI' of the data signal may be received at the second latch 122 from the delay element 152.

In some implementations, the delay element 152 may include a buffer, one or more serially coupled inverters, or a combination thereof. The second latch 122 is also configured to receive the clock signal Clk. The second latch 122 is configured to generate a second output (e.g., DO') responsive to the clock signal Clk. The second output of the second latch 122 is provided to the comparator 154. An illustrative example of a timing diagram depicting latch inputs, latch outputs, and a clock signal is described herein with reference to FIG. 2.

The comparator 154 is coupled to the first latch 120 and to the second latch 122 and is configured to receive the first output DO from the first latch 120 and the second output DO' from the second latch 122. The comparator 154 is further configured to output an indication of whether the first output DO matches (e.g., is the same as) the second output DO'. As an illustrative, non-limiting example, the comparator 154 may output a logical 0 value if the first output DO and the second output DO' match and, alternatively, may output a logical 1 value if the first output DO does not match the second output DO'. An indication output by the comparator 154 that the first output DO and the second output DO' do not match may correspond to the first latch 120 being at risk of a setup/hold violation. In some implementations, the comparator 154 is configured as an exclusive OR (XOR) logic gate.

The control circuitry 156 is coupled to the comparator 154 and configured to receive an output of the comparator 154. The control circuitry 156 includes one or more counters 158 and one or more thresholds 159. The one or more counters 156 may count a number of consecutive clock cycles of an evaluation time period in which the output of comparator 154 indicated that the first output DO matched the second output DO', a number of consecutive clock cycles in which the output of comparator 154 indicated that the first output DO did not match the second output DO', a number of clock cycles (during a time period) in which the output of comparator 154 indicated that the first output DO and the second output DO' matched, a number of clock cycles (during the time period) in which the output of comparator 154 indicated that the first output DO and the second output DO' did not match, or a combination thereof. The one or more thresholds 159 may include a maximum allowed clock frequency, a stability threshold associated with a number of clock cycles in which the output of comparator 154 indicated that the first output DO and the second output DO' matched, an instability threshold associated with a number of clock cycles in which the output of comparator 154 indicated that the first output DO and the second output DO' did not match, or a combination thereof.

The control circuitry 156 is configured to determine whether to adjust (or maintain) an operating parameter, such as the parameter 151 (e.g., a frequency of the clock signal Clk) based on an output of the comparator 154. To illustrate, the control circuitry 156 may be configured to sample the output of the comparator 154 based on the clock signal Clk and determine whether to adjust the operating parameter based on the sampled output. In some implementations, the control circuitry 156 may sample the output of the comparator 154 every clock cycle. For example, the control circuitry 156 may sample the output of the comparator 154 responsive to a transition of the clock signal Clk, such as a transition from low to high or from high to low. In some implementations, the control circuitry 145 may sample the output of the comparator 154 on based a different transition (of the clock signal Clk) from a transition of the clock signal Clk a that controls the latches 120, 122. For example, if the latches 120, 120 are configured to operate responsive to a transition of the clock signal Clk from low to high, the control circuitry 156 may sample the output of the comparator 154 responsive to the clock signal transitioning from high to low. Because effects of PVT changes may occur over a period of time, in other implementations, the control circuitry 156 may sample the output of the comparator 154 randomly or periodically.

If the output of the comparator 154 indicates that the first output DO and the second output DO' do not match, the control circuitry 156 may determine to reduce a frequency of the clock signal Clk generated by the clock circuitry 151. To adjust the frequency, the control circuitry 156 may generate a control signal 166 and send the control signal 166 to the clock circuitry 150. In some implementations, the control circuitry 156 may determine to reduce the frequency of the clock signal Clk in response to a threshold number of clock cycles in which the first output DO and the second output DO' do not match. As another example, the control circuitry 156 may determine to increase the frequency of the clock signal Clk generated by the clock circuitry 151 in response to determining that the first output DO and the second output DO' match.

The control circuitry 156 may take the form of a packaged functional hardware unit designed for use with other components, a portion of a program code (e.g., software or firmware) executable by a (micro)processor or processing circuitry, or a self-contained hardware or software component that interfaces with a larger system, as illustrative, non-limiting examples. Although the control circuitry 156 is described as being separate from the comparator 154, in other implementations, the comparator 154 may be included in the control circuitry 156.

In response to receiving the control signal 166, the clock circuitry 150 may increase, decrease, or maintain a value of the parameter 151 (e.g., the frequency of the clock signal Clk). Accordingly, the clock circuitry 150 is configured to increase, decrease, or maintain the frequency of the clock signal Clk based on a result of a comparison (performed by the comparator 154) between the first output DO and the second output DO'.

During operation of the data storage device 102, the data 162 is provided as Data_In DI to the first latch 120. The data 162 is also provided to the delay element 152 and the delay element 152 provides a delayed version of the data 162 (e.g., DI') to the second latch 122.

The clock signal circuitry 150 provides the clock signal Clk to the first latch 120 and the second latch 122. A transition of the clock signal Clk, such as a transition from low to high, causes the first latch 120 to provide a first output (e.g., Data_Out (DO)) and causes the second latch 122 to provide a second output (e.g., DO'). The first output DO is provided to the bus 121 and to the comparator 154. The second output is provided to the comparator 154.

The comparator 154 receives the first output and the second output and determines whether the first output and the second output are the same, e.g., the first output and the second output correspond to the same logical value. If the first output and the second output are the same, the comparator 154 generates an indication having a first value that indicates that the first and second outputs are the same. Alternatively, if the first output and the second output are different, the comparator 154 generates the indication having a second value that indications that the first and second outputs are different. The comparator 154 sends the indication to the control circuitry 156.

Based on a value of the indication, the control circuitry 156 determines whether to adjust one or more operating parameters of the data storage device 102. For example, the control circuitry 156 may determine to adjust the one or more operating parameters as described with reference to FIG. 4. To illustrate, in response to the value of the indicator corresponding to a risk of a setup/hold violation, the control circuitry 156 may determine to reduce a frequency of the clock signal Clk generated by the clock circuitry 150. To adjust the one or more parameters, the control circuitry 156 may generate a control signal 166. To adjust the frequency of the clock signal Clk, the control circuitry 156 may send the control signal 166 to the clock circuitry 150. In other implementations, the control circuitry 156 may determine to increase or decrease a power supply voltage supplied to the first latch 120 and the second latch 122. To increase or decrease the power supply voltage, the control circuitry 156 may send the control signal 166 to a power management integrated circuit (PMIC) of the data storage device 102.

Although the first latch 120 is described as providing the first output DO to the bus 121, in alternative implementations, the first latch 120 (and the second latch 122) may receive data from the bus 121 at an input of the first latch 120 (and at an input of the second latch 122). When the first latch 120 receives the data from the bus 121, the first latch 120 may be configured to provide the first output DO to one or more components of the controller 130.

Although the delay element 152 is described as providing a delay to the data 162, in other implementations, the delay element 152 may be configured to provide a delay to the clock signal Clk, as described with reference to FIG. 3. When the delay element 152 is configured to provide a delay to the data 162, the control circuitry 156 may be configured to identify a setup time risk. When the delay element 152 is configured to provide a delay to the clock signal Clk, the control circuitry 15 may be configured to identify a hold time risk. In some implementation, the data storage device 102 may include a first delay element configured to provide a first delay to the data 162 and may include a second delay element to provide a second delay to the clock signal Clk. The first delay and the second delay may be the same duration or may be different durations.

Although the second interface 132 is described as including a single latch (e.g., the first latch 120), the first latch 120 may be representative of multiple latches included in the second interface 132. Each latch of the multiple latches may be coupled to different a channel of the bus 121. In some implementations, the second interface 121 may include a first set of latches configured to be used to send data to the memory device 103 via the bus 121 and a second set of latches configured to be used to receive data from the memory device 103 via the bus 121. Additionally or alternatively, although the delay element 152 is described as being separate from the second latch 122, in other implementations, the delay element 152 may be incorporated into circuitry of the second latch 122. As another alternative implementation, the first latch 120 may be configured to include one or more of the delay element 152, the second latch 122, or the comparator 154. For example, the first latch 120 may include circuitry corresponding to the delay element 152, the second latch 122 and the comparator 154 and may be configured to provide the first output DO and to provide another output that correspond to an output of the comparator 154.

In some implementations, the data storage device 102 (e.g., the controller 120 or the memory device 103) may include an error correction code (ECC) engine configured to receive data, such as the data 160, and to generate one or more ECC code words (e.g., including a data portion and a parity portion) based on the data. For example, the ECC engine may receive the data 160 and may generate a codeword. To illustrate, the ECC engine may include an encoder configured to encode the data using an ECC encoding technique. The ECC engine may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples. The ECC engine may include a decoder configured to decode data read from the memory 104 to detect and correct bit errors that may be present in the data. For example, the ECC engine may correct a number of bit errors up to an error correction capability of an ECC technique used by the ECC engine.

In some implementations, the one or more counters 158 and/or the one or more thresholds 159 may be stored at the memory 104. In other implementations, the controller 130 may include or may be coupled to a particular memory, such as a random access memory (RAM), that is configured to store the one or more counters 158 and/or the one or more thresholds 159. Alternatively, or in addition, the controller 130 may include or may be coupled to another memory (not shown), such as a non-volatile memory, a RAM, or a read only memory (ROM). The other memory may be a single memory component, multiple distinct memory components, and/or may include multiple different types (e.g., volatile memory and/or non-volatile) of memory components. In some implementations, the other memory may be included in the access device 170.

Although one or more components of the data storage device 102 have been described with respect to the controller 130, in other implementations certain components may be included in the memory device 103 (e.g., the memory 104). For example, one or more of the delay element 152, the first latch 120, the second latch 122, the comparator 154, the control circuitry 156, or the clock circuitry 150 may be included in the memory device 103. Alternatively, or in addition, one or more functions as described above with reference to the controller 130 may be performed at or by the memory device 103. For example, one or more functions of the delay element 152, the first latch 120, the second latch 122, the comparator 154, the control circuitry 156, or the clock circuitry 150 may be performed by components and/or circuitry included in the memory device 103. Alternatively, or in addition, one or more components of the data storage device 102 may be included in the access device 170. For example, one or more of the delay element 152, the first latch 120, the second latch 122, the comparator 154, the control circuitry 156, or the clock circuitry 150 may be included in the access device 170 and may be provided from the access device 170 to the controller 130 upon power-up of the data storage device 102. Alternatively, or in addition, one or more functions as described above with reference to the controller 130 may be performed at or by the access device 170. As an illustrative, non-limiting example, the access device 170 may be configured to provide a data signal and a clock signal to a latch of an interface of the access device 170. Additionally, the access device 170 may be configured to provide a delayed version of the data signal or the clock signal to a second latch and to selectively adjust an operating parameter based on an output of the first latch and an output of the second latch.

The example(s) described with reference to FIG. 1 to enable "on the fly" monitoring of the bus operations may provide a real-time warning of nearing a condition of a setup time violation or a hold time violation. For example, by using the delay element 152 and the second latch 122, the first output DO and the second output DO' can be compared to provide a real-time (i.e., "on the fly") measure of a risk of setup and hold time violations. The real-time measure may enable operating the second interface 132 (e.g., the bus 121) at a "maximal" reliable clock frequency. For example, in response to identification of a risk of a setup/hold time violation, one or more parameters may be adjusted to avoid the setup/hold time violation. By adjusting one or more parameters, such as the frequency of the clock signal Clk, the second interface 132 can reliably operate with a maximal frequency during different operating conditions that result from changing PVT conditions. Accordingly, the second interface 132 may operate at rate that is higher than a rate appropriate for a worst-case scenario, thus improving an overall performance of the second interface 132.

Figure 2:
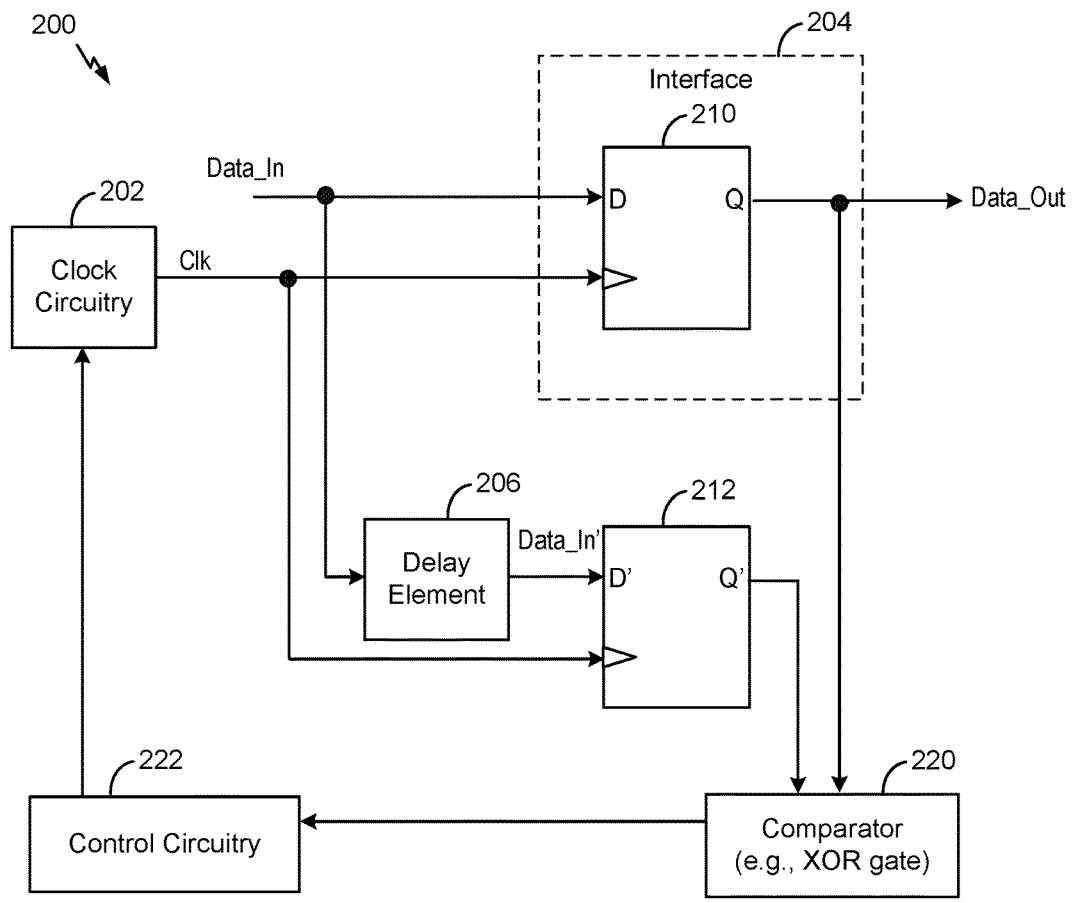
FIG. 2 is a block diagram of a particular illustrative example of a device to adjust a speed of an interface bus.
Figure 2:
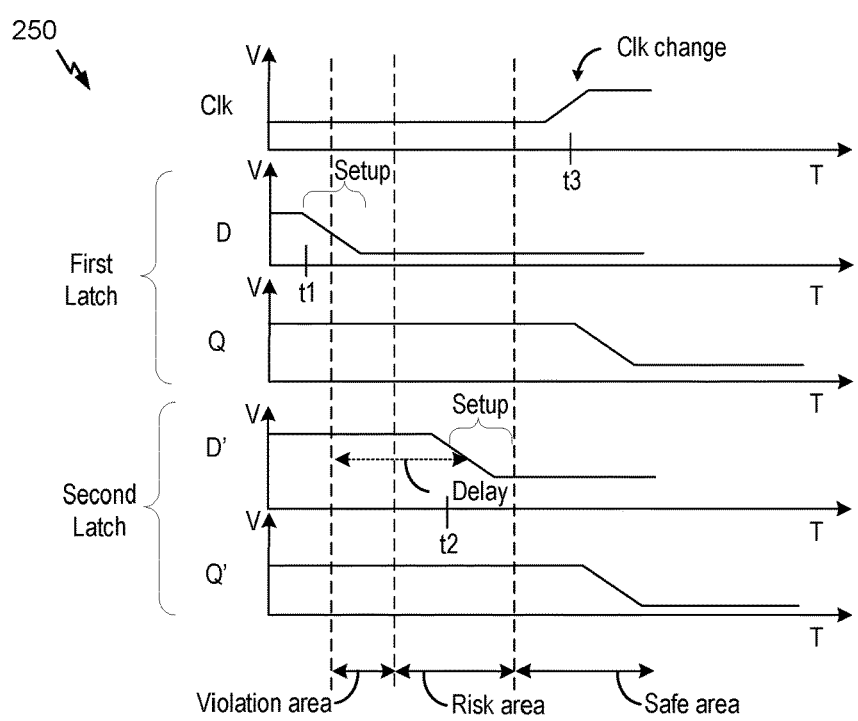

Referring to FIG. 2, a system 200 for dynamically adjusting a speed of a data bus interface is depicted. They system 200 may be included in the data storage device 102 (e.g., the controller 130 or the memory device 103) or in the access device 170 of FIG. 1.

The system 200 includes clock circuitry 202, a delay element 206, an interface 204 having a first latch 210 (e.g., a first flip-flop), a second latch 212 (e.g., a second flip-flop), a comparator 220, and control circuitry 222. The interface 204 may be configured to be coupled to a data bus (not shown), such as the bus 121 or the bus 180 of FIG. 1. The interface 204 may include or correspond to the first interface 131, the second interface 132, the third interface 108, or an interface of the access device 170 of FIG. 1. The interface 204 is configured to receive first data (Data_In) and to output second data (Data_Out). In some implementations, the first data (Data_In) is received at the interface 204 (e.g., the first latch 210) via the bus. In other implementations, the second data (Data_Out) is transmitted from the interface 204 (e.g., the first latch 210) to another interface via the bus.

The clock circuitry 202 and the delay element 206 may include or correspond to the clock circuitry 150 and the delay element 152 of FIG. 1. The delay element 206 is configured to receive the first data (Data_In) and to provide a delayed version (Data_In') of the first data (Data_In) to the second latch 212. The first latch 210 and the second latch 212 may correspond to the first latch 120 and the second latch 122, respectively, of FIG. 1. An input of the first latch 210 is designated "D" and an output of the first latch 210 is designated "Q". An input of the second latch 212 is designated "D'" and an output of the second latch 212 is designated "Q'". The comparator 220 and the control circuitry 222 may include or correspond to comparator 154 and the control circuitry 156 of FIG. 1.

Referring to the timing diagrams 250, an illustrative example of operation of the system 200 to identify a risk for a setup/hold violation is depicted. At time t1, the first latch 210 receives the first data (Data_In) that transitions from a high value (e.g., a logical 1 value) to a low value (e.g., a logical 0 value). A time period during which the first data (Data_In) transitions from the high value to the low value is associated with a setup period of the first latch 210.

The first data (Data_In) is also provided to the delay element 206, which outputs a delayed version (Data_In') to the second latch 212 at a time t2. Accordingly, at the time t2, the second latch 212 receives delayed version (Data_In') which transitions from a high value (e.g., a logical 1 value) to a low value (e.g., a logical 0 value). A time period during which the delayed version (Data_In') transitions from the high value to the low value is associated with a setup period of the second latch 212.

At time t3, the clock signal Clk transitions from a logical low value to a logical high value, which causes the output Q of the first latch 210 to match the value at time t3 of the input D of the first latch 210 and causes the output Q' of the second latch 212 to match the value at time t3 of the input D' of the second latch 212. Accordingly, responsive to the clock change at time t3, each of the first latch 210 and the second latch 212 output a logical 0 value. In the timing diagram 250, the clock change occurs in a safe area such that an output of the comparator 220 after the clock change at time t3 indicates that the first output Q of the first latch 210 and the second output Q' of the second latch 212 match. Accordingly, if the control circuitry 222 samples the output of the comparator 220 after the clock change at the time t3 (after the latches 210, 212 have completed latching), the control circuitry 222 may determine that there is no risk of a setup/hold violation. In some implementations, the control circuitry 222 may maintain one or more parameters based on a determination that there is no risk of a setup/hold violation. In other implementations, the control circuitry 222 may adjust one or more parameters based on a determination that there is no risk of a setup/hold violation. For example, based on a determination that there is no risk of a setup/hold violation, the control circuitry 222 may increase a frequency of the clock signal Clk, may increase a supply voltage, or a combination thereof.

As another example, of operation of the system 200, if frequency of clock signal Clk were increased, the clock transition at t3 is shifted to the left approaching the time t2 in the risk area as the frequency increases. If the clock change occurs during the risk area time period, the second latch 212 may not have transitioned from a logical high value to a logical low value, and the output Q' of may remain a logical high value responsive to the clock change. Accordingly, responsive to a clock change that occurs during the risk area time period, the output Q' of the second latch 212 may be a logical high value. Based on the outputs of the latches 210, 212, the comparator 220 (after the clock change during the risk area time period) may indicate that that the first output Q of the first latch 210 and the second output Q' of the second latch 212 do not match. Accordingly, based on an indication output by the comparator 220, the control circuitry 222 may determine that there is a risk of a setup/hold violation. Responsive to a determination of a risk of a setup/hold violation, the control circuitry 222 may adjust one or more parameters. For example, the control circuitry 222 may decrease a frequency of the clock signal Clk, may decrease a supply voltage, or a combination thereof.

As another example, of operation of the system 200, if frequency of clock signal Clk were increased such that the clock change occurs during a violation area time period, the first latch 210 may not have transitioned from a logical high value to a logical low value and the output Q of may remain a logical high value responsive to the clock change. In such situations, a setup/hold violation occurs which may result in an incorrect data value being output by the first latch 210. By adjusting the clock frequency so that the clock change at t3 occurs just after the risk area, the clock frequency may be set to a maximal reliable clock frequency in which proper operation of the first latch is protected by the "buffer" period introduced by the delay element 206.

As described with reference to FIG. 2, "on the fly" monitoring of the bus operations may provide a real-time warning of nearing a condition of a setup time violation. The real-time measure may to allow operating the interface 204 (and a corresponding bus) at a maximal reliable clock frequency. In response to identification of a risk of a setup violation, the control circuitry 222 may adjust a frequency of the clock signal Clk to avoid the setup time violation. By adjusting frequency, the interface 204 can reliably operate with a maximal frequency (e.g., during different operating conditions that result from changing PVT conditions). Accordingly, the interface 204 may operate at rate that is higher than a worst-case scenario rate, thus improving an overall performance of the interface 204.

Figure 3:
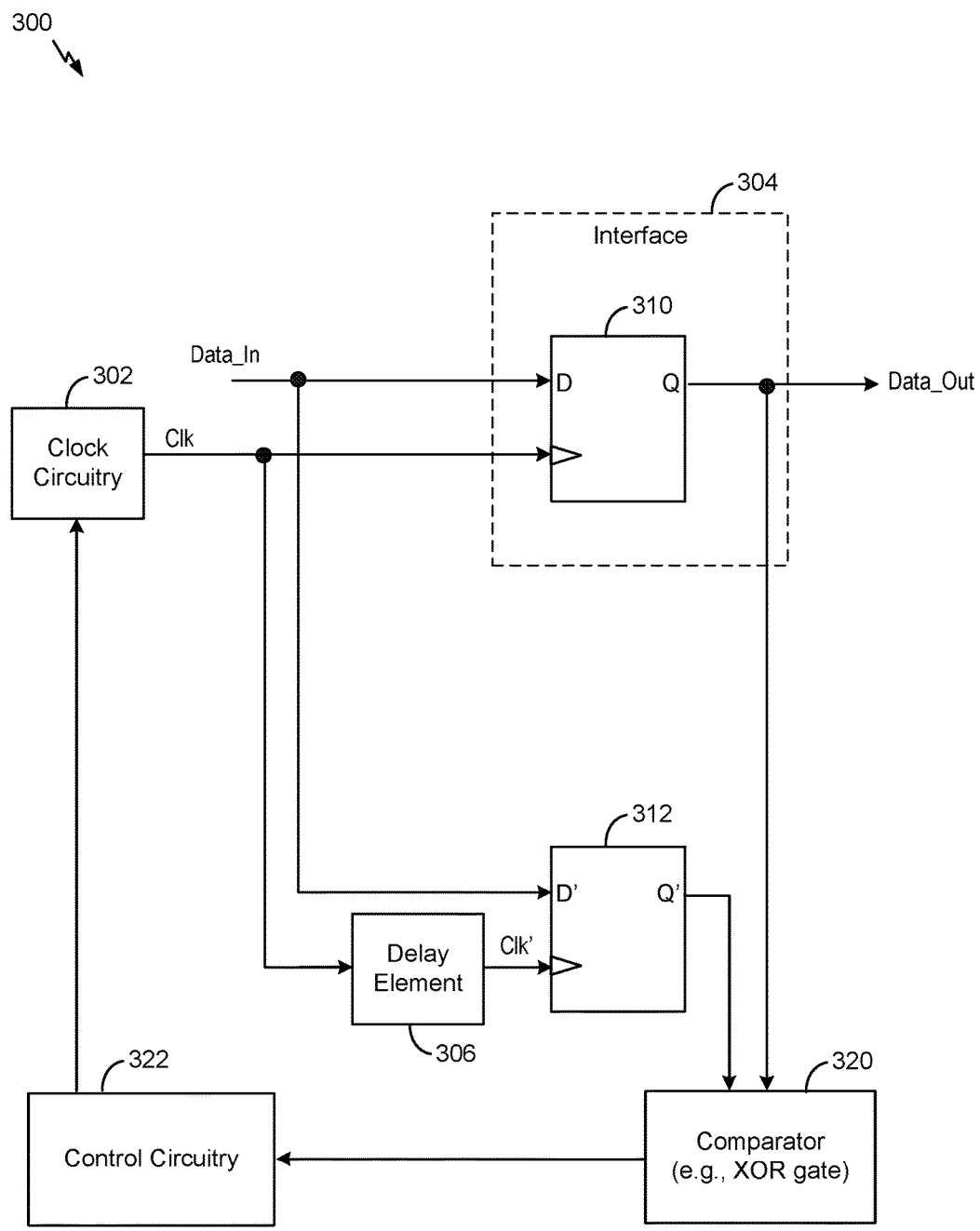
FIG. 3 is a block diagram of another particular illustrative example of a device to adjust a speed of an interface bus.

Referring to FIG. 3, a system 300 for dynamically adjusting a speed of a data bus interface is depicted. They system 300 may be included in the data storage device 102 (e.g., the controller 130 or the memory device 103) or in the access device 170 of FIG. 1.

The system 300 includes clock circuitry 302, a delay element 306, an interface 304 having a first latch 310 (e.g., a first flip-flop), a second latch 312 (e.g., a second flip-flop), a comparator 320, and control circuitry 322. The interface 304 may be configured to be coupled to a data bus (not shown), such as the bus 121 or the bus 180 of FIG. 1. The interface 304 may include or correspond to the first interface 131, the second interface 132, the third interface 108, an interface of the access device 170 of FIG. 1 or the interface 204 of FIG. 2. The interface 304 is configured to receive first data (Data_In) and to output second data (Data_Out). In some implementations, the first data (Data_In) is received at the interface 304 (e.g., the first latch 310) via the bus. In other implementations, the second data (Data_Out) is transmitted from the interface 304 (e.g., the first latch 310) to another interface via the bus.

The clock circuitry 302 may include or correspond to the clock circuitry 150 or to the clock circuitry 202 of FIG. 2. The clock circuitry 302 is configured to generate a clock signal Clk that is provided to the first latch 310 and to the second latch 312 via the delay element 306. The delay element 306 may include or correspond to the delay element 152 of FIG. 1 or to the delay element 206 of FIG. 2. The delay element 306 is configured to receive the clock signal Clk and to provide a delayed version of the clock signal Clk to the second latch 312.

The first latch 310 may correspond to the first latch 120 of FIG. 1 or to the first latch 210 of FIG. 2. A data input of the first latch 310 is designated "D" and a data output of the first latch 310 is designated "Q". The second latch 312 may correspond to the second latch 122 of FIG. 1 or to the second latch 212 of FIG. 2. A data input of the second latch 312 is designated "D'" and a data output of the second latch 312 is designated "Q'". The comparator 320 may include or correspond to comparator 154 of FIG. 1 or to the comparator 220 of FIG. 2. The control circuitry 322 may include or correspond to the control circuitry 156 of FIG. 1 or to the control circuitry 222 of FIG. 2.

Delay of clock signal Clk by the delay element 306 may result in a mismatch between the data output Q of the first latch 310 and the data output Q' of the second latch 312. A mismatch between the data output Q of the first latch 310 and the data output Q' of the second latch 312 may cause the comparator 320 to output an indication of a risk of a setup/hold violation. To illustrate, a first data value (e.g., a logical 1 value) corresponding to a first clock cycle may be provided to the first latch 310 and to the second latch 312. Based on a transition of the clock signal Clk during the first clock cycle, the first latch 310 outputs a first output value corresponding to the first data value (e.g., the logical 1 value).

Following the transition of the clock signal Clk during the first clock cycle, a second data value (e.g., a logical 0 value) corresponding to a second clock cycle may be provided to the first latch 310 and to the second latch 312. The second data value may be provided to the first latch 310 and to the second latch 312 before the second latch 312 receives a transition (corresponding to the first clock cycle) of the delayed version Clk' of the clock signal. As a result, when the delayed version Clk' of the clock cycle (associated with a first clock cycle) is received at the second latch 312, the second latch 312 outputs the second data value (logical 0 value) and not the first data value (logical 1 value). Accordingly, with respect to the first clock cycle, the comparator 320 receives the first data value (logical 1 value) from the first latch 310 and the second data value (logical 0 value) from the second latch 312. The comparator 320 outputs a logical 1 value indicating a risk of a violation to the control circuitry 322. In some implementations, the control circuitry 322 may be configured to sample an output of the comparator 320 responsive to the transition of the delayed version Clk' of the clock signal Clk. In some implementations, the control circuitry 322 may be configured to sample an output of the comparator 320 responsive to the transition of the clock signal Clk.

As described with reference to FIG. 3, "on the fly" monitoring of the bus operations may provide a real-time warning of nearing a condition of a hold time violation. The real-time measure may enable operation of the interface 304 (and a corresponding bus) at a "maximal" reliable clock frequency. In response to identification of a risk of a hold violation, the control circuitry 232 may adjust a frequency of the clock signal Clk to avoid the hold time violation. By adjusting frequency, the interface 304 can reliably operate with a "maximal" frequency during different operating conditions that result from changing PVT conditions. Accordingly, the interface 304 may operate at rate that is higher than a worst-case scenario rate, thus improving an overall performance of the interface 304.

Figure 4:
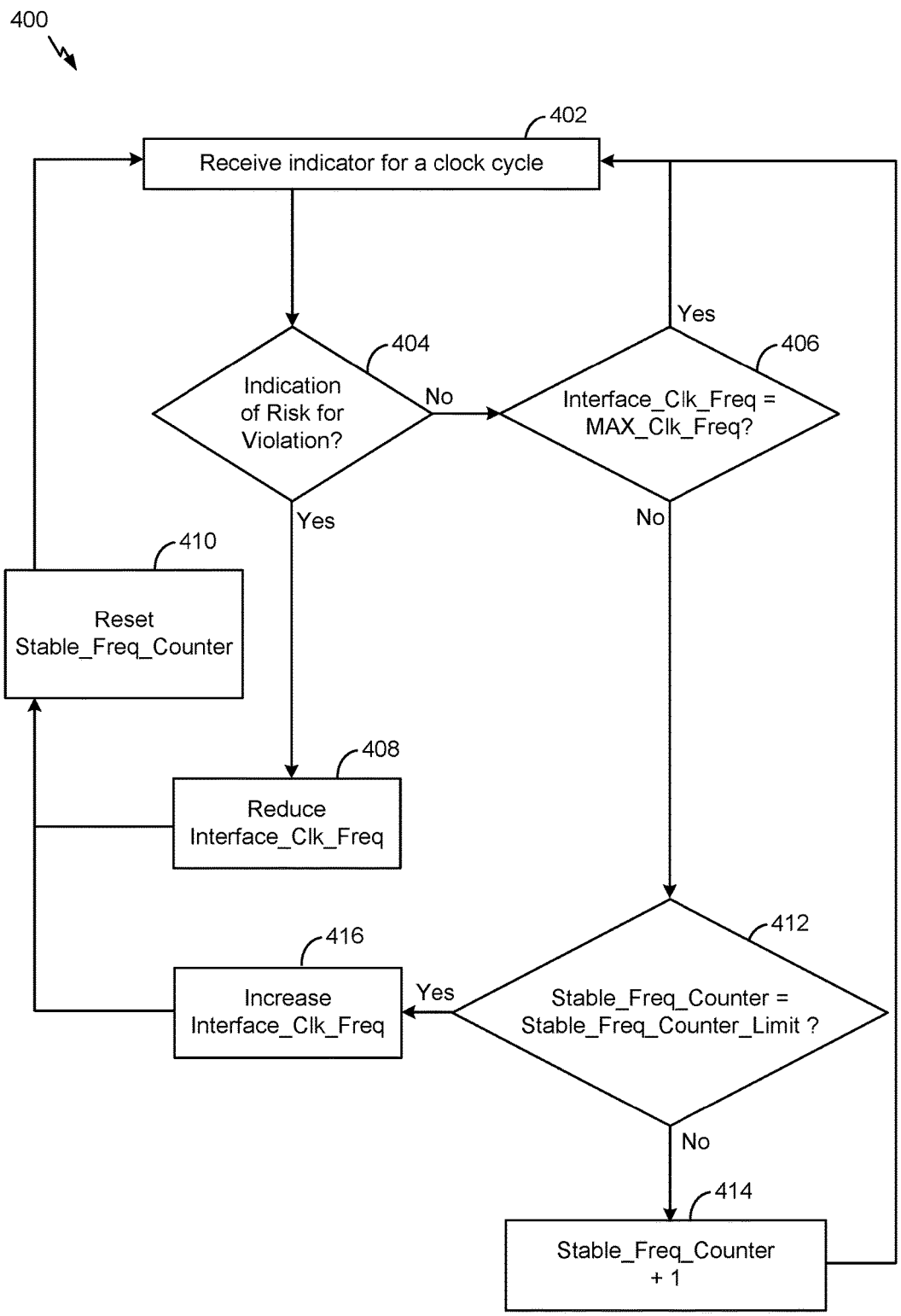
FIG. 4 is a flowchart of a particular illustrative example of a method of adjusting a speed of an interface bus.

Referring to FIG. 4, a particular illustrative example of a method of adjusting a frequency of a clock signal is depicted and generally designated 400. The method 400 may be performed at the data storage device 102, such as the controller 130 or the memory device 103, and/or the access device 170 of FIG. 1, or a combination thereof, as illustrative, non-limiting examples. For example, the method 400 may be performed by the control circuitry 150 of FIG. 1, the control circuitry 222 of FIG. 2, or the control circuitry 322 of FIG. 3.

With reference to FIG. 4, "Interface_Clk_Freq" is a current interface clock frequency of a clock signal Clk. For example, the clock signal Clk may be generated by the clock circuitry 150 of FIG. 1, the clock circuitry 202 of FIG. 2, or the clock circuitry 302 of FIG. 3. "Stable_Freq_Counter_Limit" is a pre-defined threshold of a number of cycles with stable clock frequency before increasing the interface clock frequency ("Interface_Clk_Freq"). "Stable_Freq_Counter" is a number of cycles with a stable clock frequency. In some implementations, Stable_Freq_Counter is only used while the Interface_Clk_Freq is less than a pre-defined maximum allowed clock frequency ("MAX_Clk_Freq"). "Interface_Clk_Freq" is a current clock frequency, such as a frequency of a clock signal Clk. The stable clock frequency counter "Stable_Freq_Counter" may include or correspond to the one or more counters 158 of FIG. 1. The maximum allowed clock frequency "MAX_Clk_Freq" and/or the stable frequency counter limit "Stable_Freq_Counter_Limit" may include or correspond to the one or more thresholds 159 of FIG. 1.

The method 400 includes receiving an indicator for a clock cycle, at 402. The indicator may include or correspond to an output of a comparator, such as the comparator 154 of FIG. 1, the comparator 220 of FIG. 2, or the comparator 320 of FIG. 3.

The method 400 also includes, at 404, determining whether the indicator has a value that indicates a risk for a violation, such as a setup time violation or a hold time violation. If a risk for a violation is detected, the interface clock frequency "Interface_Clk_Freq" is reduced, at 408. If a risk for a violation is not detected, the method 400 may proceed to 406.

The method 400 also includes determining whether the interface clock frequency "Interface_Clk_Freq" is equal to the maximum allowed clock frequency "MAX_Clk_Freq", at 406. If the interface clock frequency "Interface_Clk_Freq" is equal to the maximum allowed clock frequency "MAX_Clk_Freq", the method 400 may proceed to 402 to receive an indicator for a next clock cycle. The previous clock cycle and the next clock cycle may be consecutive cycles or non-consecutive clock cycles. If the interface clock frequency "Interface_Clk_Freq" is not equal to the maximum allowed clock frequency "MAX_Clk_Freq", the method 400 may proceed to 412.

At 412, the method 400 includes determining whether the stable clock frequency "Stable_Freq_Counter" is equal to the stable frequency counter limit "Stable_Freq_Counter_Limit". If the stable clock frequency "Stable_Freq_Counter" is not equal to the stable frequency counter limit "Stable_Freq_Counter_Limit", the stable clock frequency "Stable_Freq_Counter" is incremented by 1, at 414, and the method may proceed to 402. If the stable clock frequency "Stable_Freq_Counter" is equal to the stable frequency counter limit "Stable_Freq_Counter_Limit", the interface clock frequency "Interface_Clk_Freq" is increased, at 416.

The method 400 includes resetting the stable clock frequency counter "Stable_Freq_Counter", at 410. After the stable clock frequency counter "Stable_Freq_Counter" is reset, the method 400 may proceed to 402.

By monitoring and tracking indication of a risk of a setup/hold violation, a frequency of a clock signal may be dynamically adjusted "on the fly" to enable a "maximal" reliable clock frequency. For example, the "on the fly" monitoring of the bus operations may provide a real-time warning of nearing a condition of a setup time violation or a hold time violation. In response to identification of a risk of a setup/hold time violation, one or more parameters may be adjusted to avoid the setup/hold time violation. By adjusting one or more parameters, such as the frequency of the clock signal CLK, an interface can reliably operate with a "maximal" frequency (e.g., during different operating conditions that result from changing PVT conditions).

Figure 5:
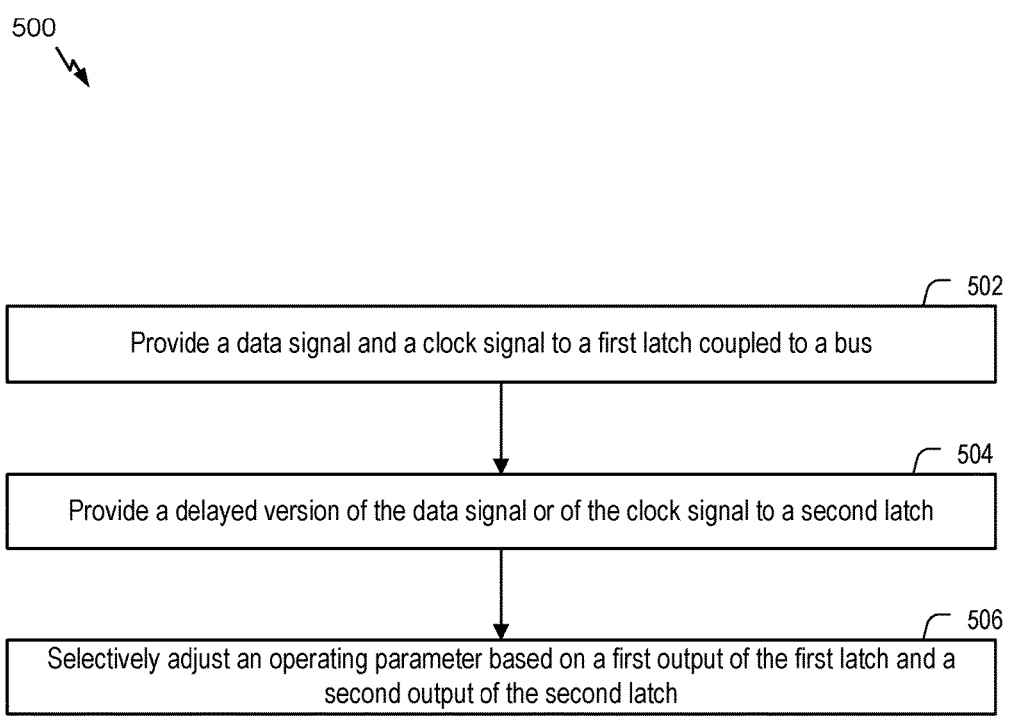
FIG. 5 is a flowchart of another particular illustrative example of a method of adjusting a speed of an interface bus.

Referring to FIG. 5, a particular illustrative example of a method of adjusting an operating parameter associated with a bus speed is depicted and generally designated 500. The method 500 may be performed at the data storage device 102, such as the controller 130 or the memory device 103, and/or the access device 170 of FIG. 1, or a combination thereof, as illustrative, non-limiting examples.

The method 500 includes providing a data signal and a clock signal to a first latch coupled to a bus, at 502. The first latch may include or correspond to the first latch 120 of FIG. 1, the first latch 210 of FIG. 2, or the first latch 310 of FIG. 3. The data signal may include or correspond to the data 162 of FIG. 1, the Data_In of FIG. 2, or the Data_In of FIG. 3. The clock signal may include or correspond to the clock Clk of FIGS. 1-3. The bus may include or correspond to the bus 121 of FIG. 1.

The method 500 includes providing a delayed version of the data signal or of the clock signal to a second latch, at 504. The second latch may include or correspond to the second latch 122 of FIG. 1, the second latch 212 of FIG. 2, or the second latch 312 of FIG. 3. The data signal or the clock signal may be delayed by a delay element, such as the delay element 152 of FIG. 1, the delay element 206 of FIG. 2, or the delay element 306 of FIG. 3.

The method 500 includes selectively adjusting an operating parameter based on a first output of the first latch and a second output of the second latch, at 506. The operating parameter may include a voltage, a clock frequency, or a combination thereof. The operating parameter may include or correspond to the parameter 151 of FIG. 1 or the interface clock frequency "Interface_Clk_Freq" of FIG. 4.

In some implementations, the method 500 may include performing a comparison based on the first output of the first latch and the second output of the second latch. For example, the comparison may be performed by a comparator, such as the comparator 154 of FIG. 1, the comparator 220 of FIG. 2, or the comparator 320 of FIG. 3. The method 500 may also include determining whether to selectively adjust the operating parameter based on a result of the comparison. In some implementations, determining whether to selectively adjust the operating parameter comprises determining whether to increase, decrease, or maintain a frequency of a clock signal. Control circuitry, such as the control circuitry 156 of FIG. 1, the control circuitry 222 of FIG. 2, or the control circuitry 322 of FIG. 3, may determine whether to adjust the operating parameter. To illustrate, the control circuitry may determine whether to adjust the operating parameter according to the method 400 of FIG. 4.

By adjusting an operating parameter based on the first output and the second output, "on the fly" (e.g., real-time) adjustments may be made to avoid setup/hold violations during operation of an interface. Additionally, by adjusting one or more parameters, such as the frequency of the clock signal Clk, an interface can reliably operate with a maximal frequency during different operating conditions that result from changing PVT conditions.

Figure 6A:
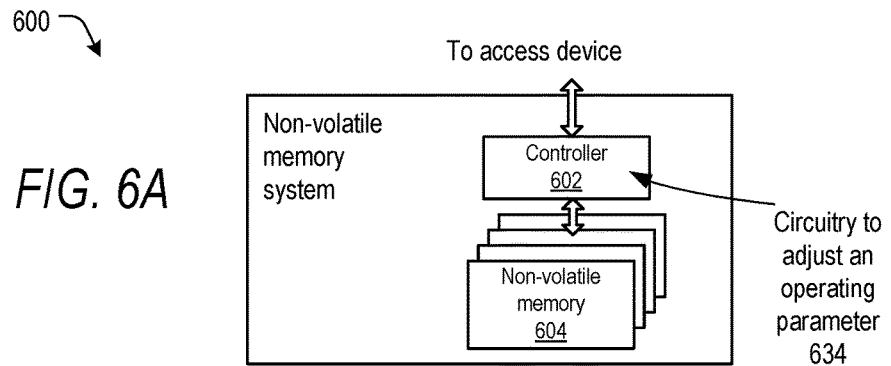
FIG. 6A is a block diagram of an illustrative example of a non-volatile memory system including a controller that includes circuitry to adjust a speed of an interface bus.
Figure 6B:
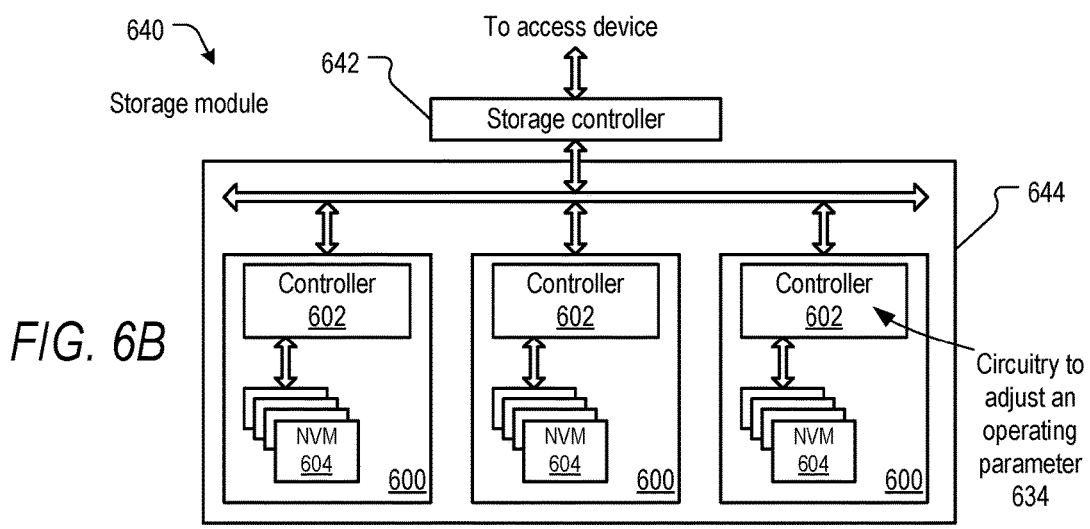
FIG. 6B is a block diagram of an illustrative example of a storage module that includes plural non-volatile memory systems that each may include a controller having circuitry to adjust a speed of an interface bus.
Figure 6C:
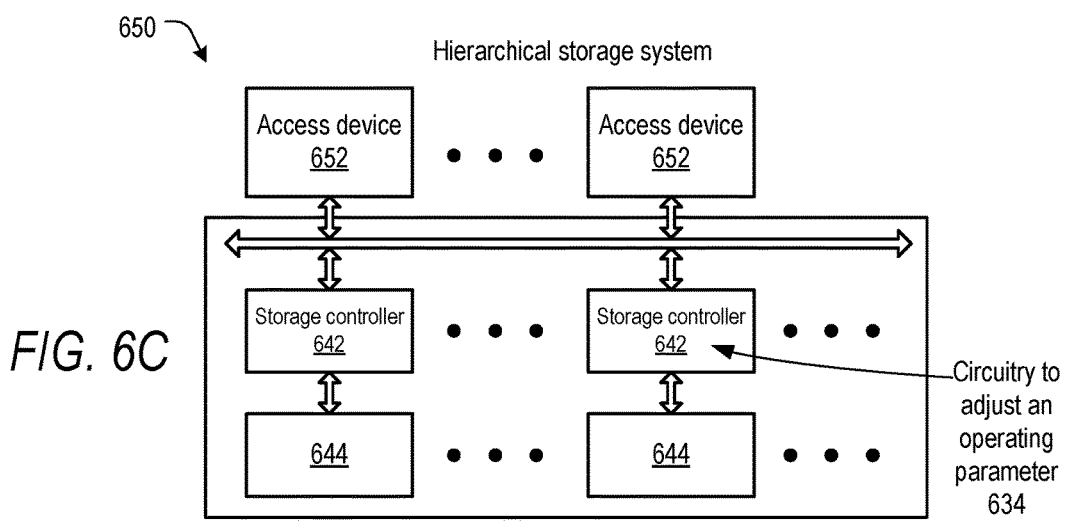
FIG. 6C is a block diagram of an illustrative example of a hierarchical storage system that includes a plurality of storage controllers that each may include circuitry to adjust a speed of an interface bus.

Memory systems suitable for use in implementing aspects of the disclosure are shown in FIGS. 6A-6C. FIG. 6A is a block diagram illustrating a non-volatile memory system 600 according to an aspect of the subject matter described herein. Referring to FIG. 6A, the non-volatile memory system 600 includes a controller 602 and non-volatile memory that may be made up of one or more non-volatile memory dies, including an illustrative non-volatile memory die 604. A "memory die" may refer to a collection of non-volatile memory cells, and associated circuitry for managing the physical operation of those non-volatile memory cells, that are formed on a single semiconductor substrate. The controller 602 interfaces with an access system, such as a host system, and transmits command sequences for read, program, and erase operations to non-volatile memory die 604. The non-volatile memory system 600 may include or correspond to the data storage device 102 of FIG. 1. For example, the controller 602 and the non-volatile memory die 604 may include the controller 130 and the memory device 103, respectively, of FIG. 1.

The controller 602 may include circuitry 634 to adjust an operating parameter. For example, the circuitry 634 may include one or more of the first latch 120, the second latch 122, the comparator 154, the delay element 152, the control circuitry 156, or the clock circuitry 150 of FIG. 1. As another example, the circuitry 634 may include one or more of the first latch 210, the second latch 212, the comparator 220, the delay element 206, the control circuitry 222, or the clock circuitry 202 of FIG. 2.

The controller 602 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and/or an embedded microcontroller, as illustrative, non-limiting examples. The controller 602 can be configured with hardware and/or firmware to perform the various functions described below and shown in the diagrams of FIGS. 2-5. Also, some of the components shown as being internal to the controller 602 can be stored external to the controller 602, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with an access device, such as a computer or electronic device. A flash memory controller can have additional functionality other than the specific functionality described herein. For example, the flash memory controller can format a flash memory to ensure the flash memory is operating properly, map out bad flash memory cells, and allocate spare cells to be substituted for future failed cells. Some part of the spare cells can be used to hold firmware to operate the flash memory controller and implement other features. In operation, an access device, such as the access device 170 of FIG. 1, communicates with the flash memory controller to read data from or write data to the flash memory. If the access device provides a logical address to which data is to be read/written, the flash memory controller can convert the logical address received from the access device to a physical address in the flash memory. In an alternative implementation, the access device can provide the physical address to the flash memory controller. The flash memory controller can also perform various memory management functions, such as, but not limited to, wear leveling (distributing writes to avoid wearing out specific blocks of memory that would otherwise be repeatedly written to) and/or garbage collection (after a block is full, moving only the valid pages of data to a new block, so the full block can be erased and reused), as illustrative, non-limiting examples.

The non-volatile memory die 604 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between the controller 602 and the non-volatile memory die 604 may be any suitable interface, such as a Toggle Mode interface. In some implementations, non-volatile memory system 600 may be a card based system, such as a secure digital (SD) or a micro secure digital (micro-SD) card. Alternatively, in other implementations, the non-volatile memory system 600 may be part of an embedded memory system.

Although, in the example illustrated in FIG. 6A, the non-volatile memory system 600 (sometimes referred to herein as a storage module) includes a single channel between the controller 602 and the non-volatile memory die 604, the subject matter described herein is not limited to having a single memory channel. For example, in some NAND memory system architectures (such as the ones shown in FIGS. 6B and 6C), 2, 4, 8 or more NAND channels may exist between the controller and the NAND memory device, depending on controller capabilities. In any of the examples described herein, more than a single channel may exist between the controller 602 and the non-volatile memory die 604, even if a single channel is shown in the drawings.

FIG. 6B illustrates a storage module 640 that includes a plurality of the non-volatile memory systems 600. As such, the storage module 640 may include a storage controller 642 that interfaces with an access device and with a storage system 644, which includes the plurality of the non-volatile memory systems 600. The interface between the storage controller 642 and the non-volatile memory systems 600 may be a bus interface, such as a serial advanced technology attachment (SATA) or a peripheral component interface express (PCIe) interface. In some implementations, the storage module 640 may be a solid state drive (SSD) which may be found in portable computing devices, such as laptop computers and tablet computers, as illustrative, non-limiting examples. Each controller 602 of FIG. 6B may include circuitry, such as the circuitry 634.

FIG. 6C is a block diagram illustrating a hierarchical storage system 650 that includes a plurality of the storage controllers 642, each of which controls a respective storage system 644. Access device systems 652 may access memories within the hierarchical storage system 650 via a bus interface. The bus interface may be a non-volatile memory (NVM) express (NVMe) or a fiber channel over Ethernet (FCoE) interface, as illustrative, non-limiting examples. In some implementations, the hierarchical storage system 650 illustrated in FIG. 6C may be a rack mountable mass storage system that is accessible by multiple access devices (e.g., host computers), such as would be found in a data center or other location where mass storage is needed. Each storage controller 642 of FIG. 6C may include the circuitry 634.

Figure 7A:
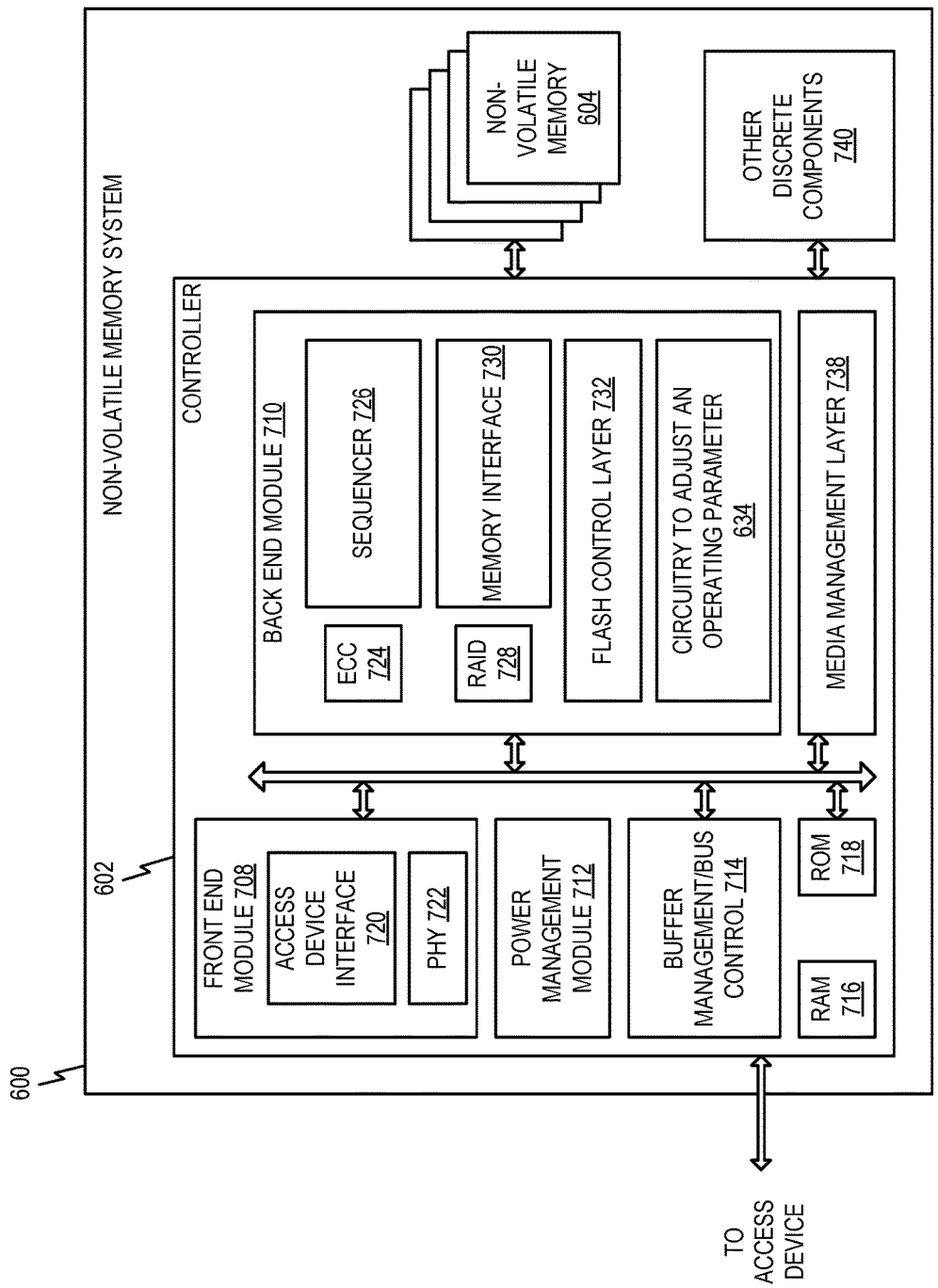
FIG. 7A is a block diagram of a first illustrative example of components included in the non-volatile memory system of FIG. 6A.

FIG. 7A is a block diagram illustrating exemplary components of the controller 602 in more detail. The controller 602 includes a front end module 708 that interfaces with an access device, a back end module 710 that interfaces with non-volatile memory dies (e.g., including the non-volatile memory die 604), and various other modules that perform other functions. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Referring again to modules of the controller 602, a buffer management/bus controller 714 manages buffers in a random access memory (RAM) 716 and controls internal bus arbitration of the controller 602. A read only memory (ROM) 718 stores system boot code. Although illustrated in FIG. 7A as located within the controller 602, in other implementations, one or both of the RAM 716 and the ROM 718 may be located externally to the controller 602. In other implementations, portions of the RAM 716 and/or the ROM 718 may be located both within the controller 602 and outside the controller 602.

The front end module 708 includes an access device interface 720 and a physical layer interface (PHY) 722 that provide an electrical interface with the access device or a next level storage controller. A type of access device interface 720 can depend on a type of memory being used. Examples of access device interface 720 include, but are not limited to, serial advanced technology attachment (SATA), SATA Express, serial attached small computer system interface (SAS), Fibre Channel, universal serial bus (USB), peripheral component interconnect express (PCIe), and NVMe. The access device interface 720 typically facilitates transfer for data, control signals, and timing signals, as illustrative, non-limiting examples. The access device interface 720 may include or correspond to the first interface 131 of FIG. 1.

The back end module 710 includes an error correction code (ECC) engine 724 that is configured to encode data, such as data bytes, received from the access device, and to decode and error correct representations of the data (e.g., representations of the data bytes) read from non-volatile memory, such as the non-volatile memory die 604. The back end module 710 may also include the circuitry 634. A command sequencer 726 may generate command sequences, such as program and erase command sequences, to be transmitted to the non-volatile memory die 604. A redundant array of independent drives (RAID) module 728 manages generation of RAID parity and recovery of failed data. The RAID parity may be used as an additional level of integrity protection for the data being written into the non-volatile memory die 604. In some cases, the RAID module 728 may be a part of the ECC engine 724. A memory interface 730 provides the command sequences to the non-volatile memory die 604 and receives status information from the non-volatile memory die 604. The memory interface 730 may include or correspond to the second interface 132 of FIG. 1. In some implementations, the memory interface 730 may be a double data rate (DDR) interface, such as a Toggle Mode interface. A flash control layer 732 controls the overall operation of back end module 710.

Additional components of the non-volatile memory system 600 illustrated in FIG. 7A include a power management module 712 and a media management layer 738, which performs wear leveling of memory cells of the non-volatile memory die 604. The non-volatile memory system 600 also includes other discrete components 740, such as external electrical interfaces, external RAM, resistors, capacitors, or other components that may interface with the controller 602. In some implementations, one or more of the physical layer interface (PHY) 722, the RAID module 728, the media management layer 738, and/or the buffer management/bus controller 714 are optional components that may be omitted from the controller 602.

Figure 7B:
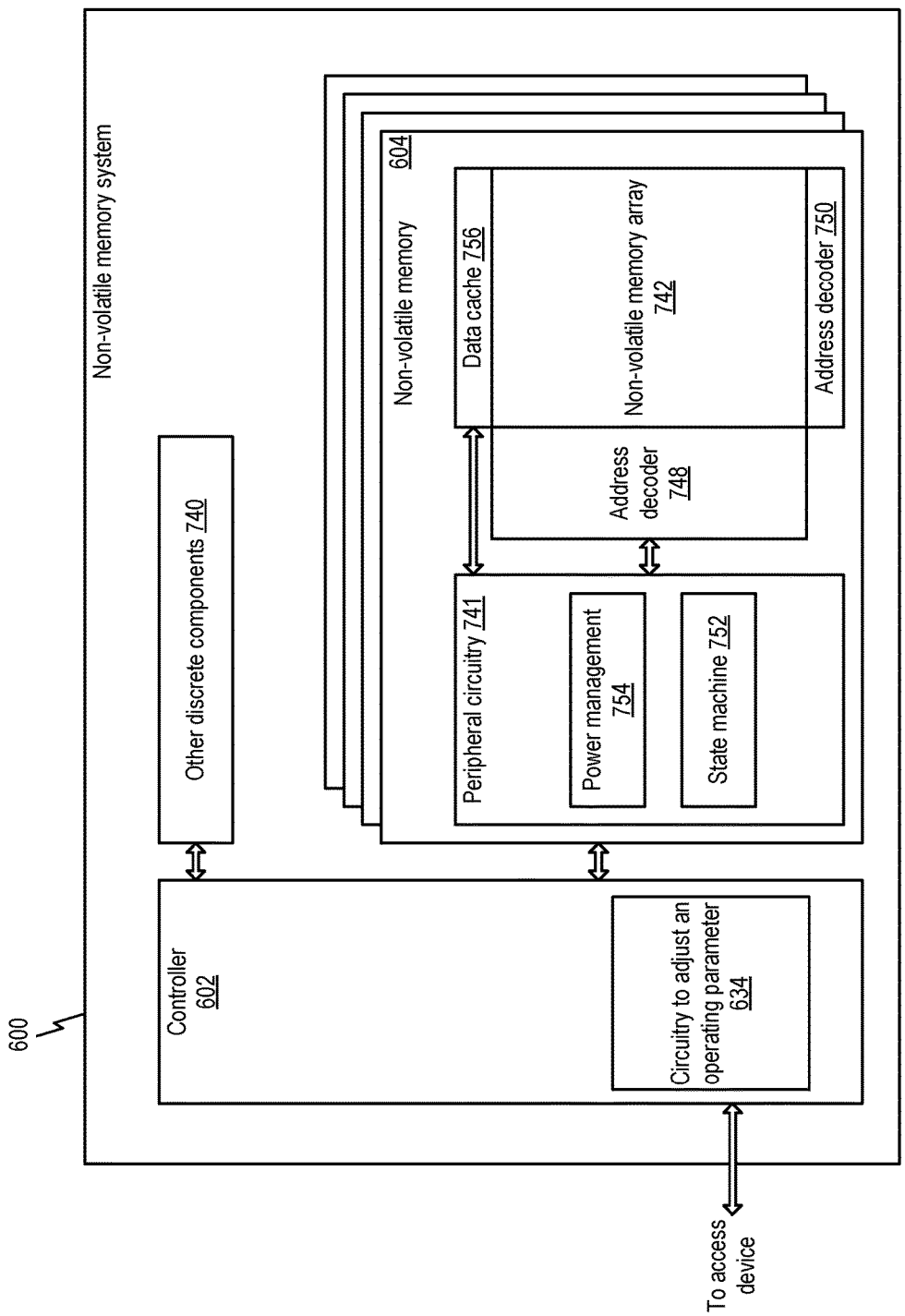
FIG. 7B is a block diagram of a second illustrative example of components included in the non-volatile memory system of FIG. 6A.

FIG. 7B is a block diagram illustrating exemplary components of the non-volatile memory die 604 in more detail. The non-volatile memory die 604 includes peripheral circuitry 741 and a non-volatile memory array 742. The non-volatile memory array 742 includes non-volatile memory cells used to store data. The non-volatile memory cells may be any suitable non-volatile memory cells, including NAND flash memory cells and/or NOR flash memory cells in a two dimensional and/or three dimensional configuration. The peripheral circuitry 741 includes a state machine 752 that provides status information to the controller 602. The controller 602 may also include the circuitry 634. The non-volatile memory die 604 further includes an address decoder 748, an address decoder 750, a data cache 756 that caches data, and power management circuitry 754.

The method 400 of FIG. 4 and/or the method 500 of FIG. 5 may be initiated or controlled by an application-specific integrated circuit (ASIC), a processing unit, such as a central processing unit (CPU), a controller, another hardware device, a firmware device, a field-programmable gate array (FPGA) device, or any combination thereof. As an example, the method 400 of FIG. 4 and/or the method 500 of FIG. 5 can be initiated or controlled by one or more processors, such as one or more processors included in or coupled to a controller or a memory of the data storage device 102, the access device 170 of FIG. 1, the non-volatile memory system 600 of FIG. 6A, and/or the storage controller 602 of FIG. 6B. A controller may be configured to perform the method 400 of FIG. 4 and/or the method 500 of FIG. 5 to adjust an operating parameter, such as a frequency of a clock signal, to avoid setup/hold time violations. As an example, one or more of the methods of FIGS. 4-5, individually or in combination, may be performed by the controller 130 of FIG. 1. To illustrate, a portion of one of the methods FIGS. 4-5 may be combined with a second portion of one of the methods of FIGS. 4-5. Additionally, one or more operations described with reference to the FIGS. 4-5 may be optional, may be performed at least partially concurrently, and/or may be performed in a different order than shown or described.

Although various components of the data storage device 102, such as the controller 130, the access device 170 of FIG. 1, the non-volatile memory system 600 of FIG. 6A, the storage module 640 of FIG. 6B, and/or the hierarchical storage system 650 of FIG. 6C are depicted herein as block components and described in general terms, such components may include one or more physical components, such as hardware controllers, one or more microprocessors, state machines, logic circuits, one or more other structures, other circuits, or a combination thereof configured to enable the various components to perform operations described herein.

In conjunction with the described aspects, an apparatus may include first means for latching a data signal responsive to a clock signal. For example, the first means for latching may include or correspond to the first latch 120 of FIG. 1, the first latch 210 of FIG. 2, the first latch 310 of FIG. 3, one or more flip-flops, one or more other structures, devices, circuits, modules, or instructions to latch a data signal, or a combination thereof.

The apparatus may also include means for delaying the data signal or a clock signal. For example, the means for delaying may include or correspond to the delay element 152 of FIG. 1, the delay element 206 of FIG. 2, or the delay element 306 of FIG. 3, one or more inverters, one or more other structures, devices, circuits, modules, or instructions to delay the data signal or the clock signal, or a combination thereof.

The apparatus may also include means for comparing a first output of the first means for latching and a second output of second means for latching, the second means for latching responsive to an output of the means for delaying. For example, the means for comparing may include or correspond to the comparator 154 of FIG. 1, the comparator 220 of FIG. 2, or the comparator 320 of FIG. 3, an exclusive OR logic gate, one or more other structures, devices, circuits, modules, or instructions to receive the delayed data signal or the delayed clock signal, or a combination thereof. Additionally, the second means for latching may include or correspond to the second latch 122 of FIG. 1, the second latch 212 of FIG. 2, the second latch 312 of FIG. 3, one or more flip-flops, one or more other structures, devices, circuits, modules, or instructions to latch a data signal, or a combination thereof.

In some implementations, the first means for latching, the means for delaying, the means for comparing, the second means for latching, or a combination thereof, may be included in a memory controller, such as the controller 130 of FIG. 1. In other implementations, the first means for latching, the means for delaying, the means for comparing, the second means for latching, or a combination thereof, may be included in a memory, such as the memory device 103. In some implementations, the memory includes a non-volatile flash memory. Additionally or alternatively, the memory may include a three-dimensional (3D) memory configuration that is monolithically formed in one or more physical levels of arrays of storage elements having an active area disposed above a silicon substrate, and where the memory includes circuitry associated with operation of the storage elements.

Components described herein may be operationally coupled to one another using one or more nodes, one or more buses (e.g., data buses and/or control buses), one or more other structures, or a combination thereof. One or more aspects of the various components may be implemented using a microprocessor or microcontroller programmed to perform operations described herein, such as one or more operations of the method the method 400 of FIG. 4 and/or the method 500 of FIG. 5.

Alternatively or in addition, one or more aspects of the data storage device 102, such as the controller 130, the access device 170 of FIG. 1, the non-volatile memory system 600 of FIG. 6A, the storage module 640 of FIG. 6B, and/or the hierarchical storage system 650 of FIG. 6C may be implemented using a microprocessor or microcontroller programmed (e.g., by executing instructions) to perform operations described herein, such as one or more operations of the method 400 of FIG. 4 and/or one or more operations of the method 500 of FIG. 5, as described further herein. As an illustrative, non-limiting example, the data storage device 102 includes a processor executing instructions (e.g., firmware) retrieved from the memory 104. Alternatively or in addition, instructions that are executed by the processor may be retrieved from a separate memory location that is not part of the memory 104, such as at a read-only memory (ROM).

In some implementations, each of the controller 130, the memory device 103, and/or the access device 170 of FIG. 1 may include a processor executing instructions that are stored at a memory, such as a non-volatile memory of the data storage device 102 or the access device 170 of FIG. 1. Alternatively or additionally, executable instructions that are executed by the processor may be stored at a separate memory location that is not part of the non-volatile memory, such as at a read-only memory (ROM) of the data storage device 102 or the access device 170 of FIG. 1.

The memory, and/or the memory device 103 (e.g., the memory 104), and/or the non-volatile memory die 604 may include a resistive random access memory (ReRAM), a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, a phase change memory (PCM) or another flash memory), an erasable programmable read-only memory (EPROM), an electrically-erasable programmable read-only memory (EEPROM), a read-only memory (ROM), a one-time programmable memory (OTP), or a combination thereof. Alternatively, or in addition, the memory 104 and/or the non-volatile memory die 604 may include another type of memory. The memory 104 of FIG. 1 and/or the non-volatile memory die 604 of FIG. 6A may include a semiconductor memory device.

Semiconductor memory devices include volatile memory devices, such as dynamic random access memory ("DRAM") or static random access memory ("SRAM") devices, non-volatile memory devices, such as magneto resistive random access memory ("MRAM"), resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some implementations include a resistivity switching storage element, such as an anti-fuse, phase change material, etc., and optionally a steering element, such as a diode, etc. Further by way of non-limiting example, active semiconductor memory elements include EEPROM and flash memory device elements, which in some implementations include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of a non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional illustrative structures described but cover all relevant memory structures within the scope of the disclosure as described herein and as understood by one of skill in the art. The illustrations of the examples described herein are intended to provide a general understanding of the various aspects of the disclosure. Other implementations may be utilized and derived from the disclosure, such that structural and logical substitutions and changes may be made without departing from the scope of the disclosure. This disclosure is intended to cover any and all subsequent adaptations or variations of various implementations. Those of skill in the art will recognize that such modifications are within the scope of the present disclosure.

The above-disclosed subject matter is to be considered illustrative, and not restrictive, and the appended claims are intended to cover all such modifications, enhancements, and other implementations, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A device comprising:
   a first latch configured to be coupled to a bus and configured to receive a data signal and a clock signal;
   a delay element configured to generate a delayed version of the data signal or a delayed version of the clock signal;
   a second latch coupled to the delay element and configured to receive the delayed version of the data signal or the delayed version of the clock signal; and
   a comparator coupled to the first latch and the second latch, the comparator configured to receive a first output from the first latch and a second output from the second latch, wherein the first latch is configured to provide the first output to the bus and to the comparator.

2. The device of claim 1, further comprising a data bus interface that includes the first latch, the data bus interface configured to be coupled to the bus.

3. The device of claim 1, wherein the first latch is configured to receive the data signal via the bus.

4. The device of claim 1, wherein the delay element is configured to delay the data signal.

5. The device of claim 1, wherein the delay element is configured to delay the clock signal.

6. The device of claim 1, wherein the comparator comprises an exclusive-or logic gate.

7. The device of claim 1, further comprising control circuitry configured to determine whether to adjust a frequency of the clock signal based on an output of the comparator.

8. The device of claim 1, further comprising clock circuitry configured to generate the clock signal.

9. The device of claim 8, wherein the clock circuitry is configured to increase, decrease, or maintain a frequency of the clock signal based on a result of a comparison between the first output and the second output.

10. The device of claim 1, further comprising the bus, the bus configured to communicatively couple a controller of a data storage device to a non-volatile memory of the data storage device.

11. A method comprising:
  in a device including a controller coupled to a non-volatile memory via a bus, performing:
    providing a data signal and a clock signal to a first latch coupled to the bus;
    providing a delayed version of the data signal or of the clock signal to a second latch;
    selectively adjusting an operating parameter based on a first output of the first latch and a second output of the second latch; and
    providing the first output of the first latch to the bus and a comparator.

12. The method of claim 11, wherein the operating parameter comprises a frequency of the clock signal.

13. The method of claim 11, further comprising:
  performing a comparison based on the first output of the first latch and the second output of the second latch; and
  determining whether to selectively adjust the operating parameter based on a result of the comparison.

14. The method of claim 13, wherein determining whether to selectively adjust the operating parameter comprises determining whether to increase, decrease, or maintain a frequency of the clock signal.

15. A device comprising:
  first means for latching a data signal responsive to a clock signal;
  means for delaying the data signal or the clock signal;
  means for comparing a first output of the first means for latching and a second output of second means for latching, the second means for latching responsive to an output of the means for delaying; and
  means for providing the first output of the first means for latching to the bus and a comparator.

16. The device of claim 15, wherein the means for delaying, the first means for latching, the second means for latching, and the means for comparing are included in a memory controller.

17. The device of claim 15, wherein the means for delaying, the first means for latching, the second means for latching, and the means for comparing are included in a memory.

18. The device of claim 17, wherein the memory comprises a non-volatile flash memory.

19. The device of claim 17, wherein the memory includes a three-dimensional (3D) memory configuration that is monolithically formed in one or more physical levels of arrays of storage elements having an active area disposed above a silicon substrate, and wherein the memory includes circuitry associated with operation of the storage elements.

* * * * *